United States Patent [19]

Schlesinger

[11] 4,113,497

[45] Sep. 12, 1978

[54] COMPOSITIONS WITH ORGANOHALOGEN COMPOUND AND DIAZONIUM SALTS AS PHOTOINITIATORS OF EPOXY COMPOUNDS IN PHOTO-POLYMERIZATION

[75] Inventor: Sheldon I. Schlesinger, East Windsor Township, Mercer County, N.J.

[73] Assignee: American Can Company, Greenwich, Conn.

[21] Appl. No.: 658,207

[22] Filed: Feb. 17, 1976

Related U.S. Application Data

[63] Continuation-in-part of Ser. No. 369,007, Jun. 11, 1973, abandoned.

[51] Int. Cl.² .......................... G03C 1/70; G03C 1/54
[52] U.S. Cl. ..................................... 96/115 P; 96/33; 96/35.1; 96/48 R; 96/49; 96/91 R; 96/115 R; 204/159.11; 204/159.14; 204/159.18; 204/159.23
[58] Field of Search .................. 96/11 SP, 11 SR, 33, 96/35.1, 91 R, 48 R, 49, 90 R; 204/159.19, 159.14, 159.23, 159.24, 159.18, 159.11; 260/141, 142, 78.3, 73.8 UA

[56] References Cited

U.S. PATENT DOCUMENTS

| | | | |
|---|---|---|---|
| 3,205,157 | 9/1965 | Licari et al. | 96/91 R |
| 3,347,676 | 10/1967 | Cripps | 96/11 SR |
| 3,396,019 | 8/1968 | Uhlig | 96/75 |
| 3,450,613 | 6/1969 | Steinberg | 204/159.23 |
| 3,497,353 | 2/1970 | Steppan et al. | 96/115 R |
| 3,551,246 | 12/1970 | Bassemir et al. | 204/159.23 |
| 3,551,311 | 12/1970 | Nass et al. | 204/159.23 |
| 3,622,333 | 11/1971 | Cope | 96/75 |
| 3,679,419 | 7/1972 | Gillich | 96/75 |
| 3,692,560 | 9/1972 | Rosenkranz | 96/115 R |
| 3,711,390 | 1/1973 | Feinberg | 96/115 P |
| 3,779,768 | 12/1973 | Cope et al. | 96/49 |
| 3,782,952 | 1/1974 | Golda et al. | 96/93 |
| 3,804,735 | 4/1974 | Radlove et al. | 204/159.19 |

FOREIGN PATENT DOCUMENTS

1,018,559  1/1966  United Kingdom .............. 260/78.3 R

*Primary Examiner*—Charles L. Bowers, Jr.
*Attorney, Agent, or Firm*—Robert P. Auber; Ira S. Dorman; Ernestine C. Bartlett

[57] ABSTRACT

Photopolymerizable compositions and processes for photopolymerizing such compositions are provided, said process comprising admixing with said epoxides, photosensitive organohalogen compounds and thereafter applying energy to the resulting mixture. The organohalogens decompose to liberate an active catalyst which then serves to initiate polymerization of the epoxide material.

6 Claims, No Drawings ns with Organohalogen Compound and Diazonium Salts as Photoinitiators of Epoxy Compounds in Photo-Polymerization

CROSS-REFERENCE TO RELATED APPLICATION

This application is a continuation-in-part of application Ser. No. 369,007, filed June 11, 1973, now abandoned, entitled "Organohalogen Compounds As Photoinitiators of Epoxy Photopolymerization".

BACKGROUND OF THE INVENTION

It had heretofore been known in isolated instances in the literature that epoxy monomers may be polymerized by the action of electromagnetic radiation. For example, Penezek et al. in *Die Makromolekular Chemie*, 97 (1966) have reported that gamma radiation will effect polymerization of cyclohexene oxide. However, this type of reaction does not generally occur with most epoxy monomers. Additionally gamma radiation is not a convenient source of radiation and not as useful as the ultraviolet and visible regions of the spectrum. Therefore, for quite some time now, polymerization of epoxy monomers has been carried out by heating to high temperatures the monomer in which a chemical compound was incorporated, until catalysts contained therein were activated. The activation of the catalyst upon heating thereby initiated polymerization of the epoxy monomers. These methods, though successful, are unsatisfactory in that careful attention must be given to staying within the temperature limitations of the system involved. In order to prevent the harmful effects of heat curing, it is often necessary to extend the curing cycle an unreasonable length of time.

More recently, it has been discovered that epoxides may be photopolymerized employing aryl diazonium salts as photosensitive precursors. Such a procedure forms the subject matter of my U.S. Pat. No. 3,708,296 issued Jan. 2, 1973.

It has now been discovered that another class of compounds, the organohalogens, are effectively photosensitive to initiate photopolymerization of epoxides and such compounds offer a viable and attractive alternative to the use of aryl diazonium catalysts.

Organohalogens have been known for some time as free-radical initiators in photopolymerization processes where polymerization is initiated via the double bonds of an unsaturated compound. Free-radical polymerizations however are known to suffer in general from the undesirable characteristic that the polymerization is subject to inhibition by molecular oxygen. Furthermore, it is often necessary to include a free-radical inhibitor, for example, p-methoxyphenol, in such mixtures to prevent premature polymerization when the mixtures are stored in the dark.

It has now been discovered that such organohalogen compounds are effective as photoinitiators for epoxide materials which are polymerized through a cationic rather than free-radical mechanism. Moreover, it has been found that such organohalogen compounds, when combined with certain aryl diazonium salts, function synergistically to initiate photopolymerization of epoxide materials.

It has been further discovered that epoxide materials, when halogenated and subjected to the application of energy, may be photopolymerized in the absence of any additional photoinitiator.

The above discovery of the effectiveness of organohalogens as initiators for the photopolymerization of cationically polymerizable epoxides is surprising in view of their known tendency to form free-radicals on exposure to radiation and the difficulties normally experienced with free-radical initiated polymerization taken together with the fact that epoxides are known to be polymerizable through a cationic mechanism. Indeed, workers in the art have reported that organohalogen compounds are ineffective for such cationic polymerizations. See for example, Cripps et al., U.S. Pat. No. 3,347,676 issued Oct. 17, 1967, wherein polychlorinated biphenyls were ineffective to initiate photopolymerization of cationically initiated monomers. Another example is Smith, U.S. Pat. No. 3,515,552 issued June 2, 1970, which discloses that a specific class of compounds, e.g., vinyl ethers characterized by undergoing more rapid polymerization than other cationically polymerizable materials, were photopolymerized with organohalogen initiators. In this procedure, however, polymerization takes place via the double bonds in the vinyl ethers. To date, there has been no procedure which recognized that epoxide compounds, polymerizable cationically through the opening of oxirane rings rather than through double bonds, could be effectively photopolymerized employing organohalogen compounds.

SUMMARY OF THE INVENTION

Accordingly, the present invention relates to photopolymerizable compositions comprising an epoxide material polymerizable to higher molecular weights and, as a latent catalyst precursor therefor, an organohalogen compound which decomposes upon application of energy to release an active catalyst which initiates the polymerization and to processes for effecting such polymerization.

The invention is further directed to photopolymerizable materials comprising an epoxide material in admixture with a synergistic combination of latent precursors which decompose upon application of energy to release active catalysts, said precursors being aromatic diazonium salts of complex halogenides in combination with organohalogens.

Additionally, this invention is related to photopolymerizable compositions comprising a halogenated epoxide material which, when subjected to the application of energy, releases an active catalyst which is effective to initiate polymerization in the absence of any additional photoinitiator.

DETAILED DESCRIPTION OF THE INVENTION

Thus, in accordance with the procedure of this invention, a mixture is formed of an epoxide material in admixture with a latent catalyst precursor selected from the group consisting of (1) an organohalogen compound or (2) a synergistic mixture of an organohalogen with an aryl diazonium salt of a complex halogenide or, alternatively, a halogenated epoxide material in the absence of the latent catalyst precursor. The composition at a convenient time subsequently is exposed to electromagnetic radiation or other energy sources to release an active catalyst or catalysts which effects the polymerization of the epoxide material. In some instances, the composition is heated following exposure.

The Organohalogens

Any organic halogen compound that decomposes under the action of suitable energy sources for example, electromagnetic radiation, to release an active catalyst effective to initiate polymerization of the epoxide material, and in which the halogen is of an atomic number of 9-53, e.g., fluorine, chlorine, bromine, and iodine, may be employed herein.

The organohalogen is believed to decompose under the action of such energy to liberate halogen atoms as shown in equation 1, utilizing carbon tetrabromide, for example:

  (1)

The halogen is then believed to initiate polymerization of the epoxide by either or several of:

(A) Abstracting a hydrogen atom from a solvent or the monomer to form an acid (HX) or
(B) Reacting with a metal, for example, a metal substrate to which the composition is applied, to form a Lewis acid halide or
(C) Acting as a Lewis acid by itself to initiate polymerization.

Preferably, the compound will exhibit bond dissociation energies for the carbon to halogen bond of between about 40 and 70 kilogram calories per mole or less and especially 60 kilogram calories per mole or less. In general, organic bromides and iodides require less energy to dissociate, provide stronger acids upon dissociation, and are preferred herein for these reasons. Similarly, aliphatic halides require less energy for bond dissociation than aromatic halides, while polyhalogenated compounds provide more available halogen atoms per mole of compound than monohalides. Accordingly, the most preferred compounds for use herein will be polyhalogenated aliphatic bromides or iodides or polyhalogenated aliphatic groups contained as substituents on aromatic rings.

Although the above discussed compounds are preferred, many and various organohalogens may be employed in which the organic radicals are alkyl, aryl, aryl substituted by hydroxyl, amine, etc. aralkyl, alkaryl, alkoxy, aroxy, heterocyclic, organo-metallic, etc., as long as they are compatible with the epoxide component of the system and function to release an active catalyst in accordance with the invention.

The following illustrative organohalogen compounds may be employed as components of the photopolymerizable compositions herein: carbon tetrabromide; tetra (bromomethyl) methane; tetrabromoethylene, 1,2,3,4-tetrabromobutane; trichloroethoxyethanol; p-iodobenzene; bromobenzene; iodoform; p-bromophenol; p-iodobiphenyl; N-bromosuccinimide; α,α'-dibromo-p-xylene; phenylquinaldinium iodide; phenylchromium iodide-chloroform complex, $(C_6H_5) Cr .II . 2CHCl_3$; chloroform; bromoform; 2,6-dibromophenol; 1-bromo-2-naphthol; p-bromoaniline; hexachloro-p-xylene; trichloroacetanilide; p-bromodimethylaniline; tetrachlorotetrahydronaphthalene; α,α'-dibromoxylene; α,α,α',α'-tetrabromoxylene; hexabromoethane; hexabromocyclohexane; tetrafluoroethylene; hexafluoroethane; etc. Especially preferred are halogenated aliphatic and aromatic hydrocarbons and particularly compounds selected from the group of iodoform, bromoform, carbon tetrabromide and α,α'-dibromoxylene.

The Epoxide

Any monomeric or prepolymeric material, or mixture of such materials, of suitable viscosity or suitable miscibility in solvents, which is polymerizable to higher molecular weights through the action of a cationic catalyst, may be utilized in the process and compositions of the present invention. In a preferred embodiment, any polymerizable, monomeric or prepolymeric epoxide material selected from the group of the representative classes of epoxides including glycidyl ethers of bisphenol A; epoxy-cyclolkanes; alkylene oxides; monoglycidyl ethers including those of the formula

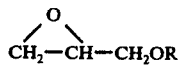

wherein R is aryl or alkyl; epoxy esters; epoxy phenol or cresol novolacs; halogenated epoxides, epoxy-vinyls and bis (epoxy alkyl) ethers of alkylene glycols.

Glycidyl ethers of bisphenol A include the classic epoxy resin obtained by the well known reaction of epichlorohydric and bisphenol A (4,4'-isopropylidenediphenol). The reaction product is believed to have the form of a polyglycidyl ether of bisphenol A (the glycidyl group being more formally referred to as the 2,3-epoxypropyl group) and this may be thought of as a polyether derived from the diphenol and glycidol (2,3-epoxy-1-propanol). The structure usually assigned to the resinous product is

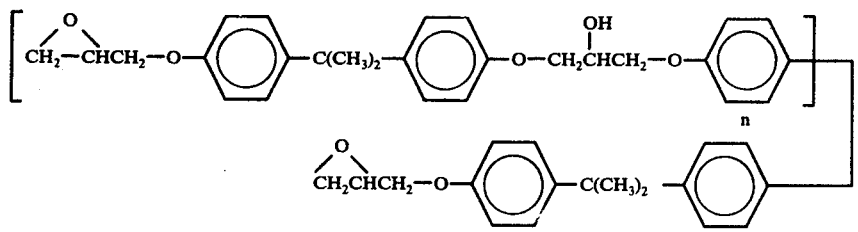

a viscous liquid epoxy resin, average molecular weight about 380, is obtained by reacting the epichlorohydrin in high molecular proportion relative to the bisphenol A, the reaction product containing well over 85 mole percent of the monomeric diglycidyl ether of bisphenol A (n=0), which may be named 2,2-bis[p-(2,3-epoxypropoxy)phenyl] propane, and smaller proportions of polymers in which n is an integer equal to 1, 2, 3, etc. This product exemplifies epoxide monomers and prepolymers, having a moderate molecular weight, preferably of the order of 1,000, or less, which may be crosslinked or otherwise polymerized in accordance with the invention, whereby cleavage of the terminal epoxy or oxirane rings is initiated by the action of the active catalyst released when energy is applied to the latent polymerization catalyst.

Many other epoxide materials are available in polymerizable monomeric or prepolymeric forms. Among these are epoxy-cyclohydrocarbons including 1,2-epoxy-cyclohexane (cyclohexene oxide, also named 7-oxabicyclo-[4.1.0] heptane); and vinylcyclohexene dioxide, more specifically named 3-(epoxyethyl)-7-oxabicyclo[4.1.0]-heptane or 1,2-epoxy-4-(epoxyethyl) cyclohexane. Other epoxidized cyclohydrocarbons may be used, a readily available polycyclic diepoxide being dicyclopentadiene dioxide, more specifically identified as 3,4-8,9-diepoxytricyclo[5.2.1.0$^{2,6}$]decane.

Alkylene oxides, for example, ethylene oxide (oxirane,

the simplest epoxy ring) and its homologues generally, e.g., propylene oxide (1,2-epoxypropane) and 2,3-epoxybutane, are themselves useful; other useful epoxidic cyclic ethers are the $C_3O$ ring compound trimethylene oxide (oxetane), derivatives thereof such as 3,3-bis(-chloromethyl)oxetane (also named 2,2-bis (chloromethyl)-1,3-epoxypropane), and the $C_4O$ ring compound tetrahydrofuran, as examples. A suitable polyfunctional cyclic ether is 1,3,5-trioxane.

Glycidyl esters of acrylic acid and of its homologs, methacrylic acid and crotonic acid, are vinyl epoxy monomers of particular interest. Other suitable vinyl epoxides monomers are monoglycidyl ethers such as allyl glycidyl ether (1-allyloxy-2,3-epoxypropane) as well as copolymers thereof with glycidyl methacrylate particularly as disclosed and claimed in co-pending U.S. Application, Ser. No. 297,829 filed Oct. 16, 1972, now abandoned.

Mono-glycidyl aryl or alkyl ethers such as glycidyl phenyl ether (1,2-epoxy-3-phenoxypropane (as well as other ethers of the structure

where R is alkyl, or aryl, and mixtures thereof may be used. One such mixture contains predominantly glycidyl octyl ether and decyl glycidyl ether; another contains dodecyl glycidyl ether and glycidyl tetradecyl ether.

Epoxidized novolak and epoxy cresol novolak prepolymers likewise may be used, as well as polyolefin (e.g. polyethylene) epoxides. The latter are exemplified by epoxidized, low molecular weight by-products of the polymerization of ethylene, which may be separated as mixtures high in 1-alkenes in the range from about 10 to 20 carbon atoms, that is from about 1-decene to about 1-eicosene. Epoxidation then provides mixtures of the corresponding 1,2-epoxyalkanes, examples being mixtures high in the 1,2-epoxy derivatives of alkanes having 11 to 14 carbons, or having 15 to 18 carbons.

Epoxy esters such as esters of epoxidized cyclic alcohols, or of epoxidized cycloalkanecarboxylic acids, or of both, provide useful epoxide or polyepoxide materials. Thus a suitable ester of epoxidized cyclohexanemethanol and epoxidized cyclohexanecarboxylic acid is the diepoxide (3,4-epoxy-cyclohexyl)methyl 3,4-epoxycyclohexanecarboxylate. Another suitable diepoxide may be obtained as an ester of a substituted (epoxycycloalkyl)methanol and a dibasic acid, for example, bis[3,4,-epoxy-6-methylcyclohexyl)methyl] adipate, which may be named alternatively bis[4-methyl-7-oxabicyclo-[4.1.0] hept-3-yl)methyl] adipate.

Diepoxide monomeric materials may be obtained conveniently as bis (epoxyalkyl) esters of alkylene glycols, an example being the diglycidyl ether of 1,4-butanediol, that is, 1,4-bis-(2,3-epoxypropoxy)butane. This diepoxide is related to the diglycidyl ether of bisphenol A, shown above as 2,2-bis[p-(2,3-epoxypropoxy)phenyl]propane.

Various halogenated epoxides are also encompassed in the list of operable epoxide materials for use herein. In a preferred embodiment of the invention, where the epoxide is halogenated, no further catalyst precursor is needed. It should be understood that such halogenated epoxides may also be employed with an organohalogen without detrimental effect. Such halogenated epoxide materials are those with photolabile halogen substituents, preferably with bromine and iodine substituents. Illustrative of such halogenated epoxides are many commercially available resins including the following:

| Epoxide | Epoxy Equiv. Weight | Viscosity cps at 25° C | Comments |
|---|---|---|---|
| Araldite[1] 8011 | 455–500 | 70–80 | Solid epoxy containing 21% Br. |
| Araldite 9147 | 222 | 370 at 70° C | Epoxy-resin 20% Br. |
| DER[2] 511 | 445–520 | 68–80 | Epoxy resin 18–20% Br. |
| DER 542 | 330–380 | 51–61 | Epoxy resin based on tetra-bromobisphenol A, 44–48% Br |
| Epirez[3] 5161 | 308 | 34.5 | Epoxy resin 30% Cl |
| Epirez 529 | | | epoxy-novalac, 13% Br |
| Epirez 5163 | 450 | 60 | epoxy resin, 50% Br |
| Epon[4] H-45 | 430 | — | Epoxy resin, 18% Br |
| QX[5] 3441.4 | 450–550 | 65–80 | Epoxy resin, 13.5–14.5% Br |
| QX 3441.5 | 550–625 | 80–90 | Epoxy resin, 22–24% Br |

[1] Available commercially, Ciba-Geigy, Ardsley, N.Y.
[2] Available commercially, Dow Chem. Co., Midland, Mich.
[3] Available Commercially, Celanese Corp., N.Y., N.Y.
[4] Shell Chemical Corp., N.Y., N.Y.
[5] Dow Chemical Co., Midland, Mich.

The Aryl Diazonium Complex Halogenides

In accordance with the invention, certain aryl diazonium salts of complex halogenides have been found to function synergistically when combined with organohalogen compounds of the invention. Specifically, such effect has been discovered with amino-aryldiazonium salts of complex halogenides in which said amino group may be present as a substituent on the aryl ring as well as compounds in which the amino group is part of a heterocyclic ring. Such aryldiazonium compounds require the application of heat following light exposure to aid in curing when employed as photoinitiators for epoxide photopolymerization as disclosed in U.S. Pat. No. 3,708,296 referred to hereinabove. It is believed that such requirement for heat is necessitated because the Lewis acid released is complexed to the basic amino nitrogen and is therefore unavailable to the epoxy groups to initiate polymerization or crosslinking in the absence of the post-heating step. It is believed that the synergistic effect realized with the organohalogens occurs because, as a result of photolysis, an acidic product (HX) is provided which neutralizes the effect of the amino nitrogen and releases the Lewis acid derived from the diazonium salt. In any event, as illustrated further hereinbelow, there is a decided synergistic effect obtained with the combined catalysts.

The preferred photosensitive Lewis acid catalyst precursors are aromatic diazonium salts of complex halogenides, which decompose upon application of energy to release a halide Lewis acid. The aromatic diazonium cation may be represented generally as [Ar—N+≡N], where the aryl group Ar, which may be an alkaryl hydrocarbon group, is bonded to the diazonium group by replacing one of the hydrogen atoms on a carbon atom of the aromatic nucleus, and where the aryl group ordinarily carries at least one amino substituent. Other substituents such as alkyl, alkoxy, etc. may also be present. The complex halogenide anion may be represented by $[MX_{n+m}]^{-m}$. Thus, the photosensitive salt and its decomposition upon actinic irradiation may be depicted as follows:

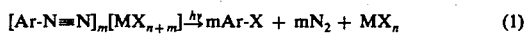

$$[Ar\text{-}N\!\equiv\!N]_m[MX_{n+m}]^{-h} \xrightarrow{h\nu} mAr\text{-}X + mN_2 + MX_n \qquad (1)$$

where X is the halogen ligand of the complex halogenide, M is the metallic or metalloid central atom thereof, $m$ is the net charge on the complex halogenide ion and the number of diazonium cations, and $n$ is the $y$ number of halogen atoms in the halide Lewis acid compound released. The Lewis acid halide $MX_n$ is an electron pair acceptor, such as $FeCl_3$, $SnCl_4$, $PF_5$, $AsF_5$, $SbF_5$, $BBF_3$, and $BiCl_3$ etc. which upon suitable irradiation of the diazonium complex salt is released in substantial quantities and initiates or catalyzes the polymerization process, wherein the monomeric or prepolymeric material is polymerized, crosslinked and interacted as the result of the actinic irradiation.

The diazonium compounds of the present invention may be prepared using procedures known in the art, as disclosed in U.S. Pat. No. 3,708,296 issued Jan. 2, 1972 to S. Schlesinger and commonly assigned herewith and such preparation forms no part of the present invention.

Illustrative of the aromatic diazonium cations comprised in the photosensitive catalyst salts utilized in accordance with the present invention are the following:

2-chloro-4-(dimethylamino)-5-methoxybenzenediazonium
p-morpholinobenzenediazonium
2,5-dichloro-4-morpholinobenzenediazonium
2,5-dimethoxy-4-morpholinobenzenediazonium
4-(dimethylamino)-naphthalenediazonium Illustrative of the complex halogenide anions comprised in the photosensitive catalyst salts utilized in accordance with the present invention are the following:

tetrachloroferrate(III), $FeCl_4^-$
hexachlorostannate (IV), $SnCl_6^{2-}$
tetrafluoroborate, $BF_4^-$
hexafluorophosphate, $PF_6^-$
hexafluoroarsenate(V), $AsF_6^-$
hexafluoroantimonate(V), $SbF_6^-$
pentachlorobismuthate(III), $BiCl_5^{2-}$ A selection of amino-containing - aromatic diazonium salts of complex halogenides is listed in Table I of U.S. Pat. No. 3,708,296 referred to above as well as U.S. Pat. No. 3,721,617 issued Mar. 20, 1973, the disclosures of which are incorporated herein by the aforegoing reference.

A general application of the process of the invention can be as follows: the photopolymerizable composition as heretofore defined is admixed in a suitable medium and, for instance, in one embodiment of the invention, the mixture is thereafter coated on a suitable substrate such as metal plate, plastic or paper, and the substrate is exposed to an energy source. On exposure, the catalyst precursor or precursors decompose to release an active catalyst which initiates the polymerization of the epoxy monomer. The resulting polymer is resistant to most solvents and chemicals.

The source of radiation for carrying out the method of the present invention can be any suitable source, such as the ultraviolet actinic radiation produced from a mercury, xenon, or carbon arc, or the electron beam produced in a suitably evacuated cathode ray gun. The only limitation placed on the radiation source used is that it must have an energy level at the irradiated film sufficient to impart to the polymerizable system energy at an intensity high enough to reach the decomposition level of the photosensitive compounds. As previously noted, the wavelength (frequency) range of actinic radiation is chosen to obtain sufficient absorption of energy to excite the desired decomposition.

For an imaging system, the mixture, which may contain a suitable solvent in substantial proportions, is coated on a metal plate, dried if necessary to remove solvent present, and the plate is exposed to ultraviolet light through a mask or negative. Thel light initiates polymerization which propagates rapidly in the exposed image areas. The resulting polymer in the exposed areas is resistant to many or most solvents and chemicals, while the unexposed areas can be washed with suitable solvents to leave a reversal image of the polymer in this embodiment.

The polymers produced by the polymerizing process of the present invention are useful in a wide variety of applications in the field of graphic arts, due to their superior adhesion to metal surfaces, excellent resistance to most solvents and chemicals, and capability of forming high resolution images. Among such uses are photoresists for chemical milling, gravure images, offset plates, stencil-making, microimages for printed circuitry, thermoset vesicular images, microimages for information storage, decoration of paper, glass, and packages, and light-curable coatings.

The procedures for mixing the radiation-sensitive compositions of the present invention are relatively simple. The polymerizable mixture is combined with the catalyst precursor or combination of the same with a suitable inert volatile solvent. By such a suitable inert solvent is meant any solvent which does not react appreciably in the dark with the epoxide material and catalyst precursor. Examples of such solvents include acetone, acetonitrile, toluene, xylene, methyl ethyl ketone, ethylene glycol, monomethyl ether, ethyl ether, dimethyl ether of diethylene glycol, monochlorobenzene, tetrachloroethane, trichloroethylene, 1,1,2,2-tetrachloroethane, o-chlorotoluene, o-dichlorotoluene or mixtures thereof. It will be apparent from a reading of the solvents listed that many of the organohalogens suitable as catalyst precursors are also solvents for the compositions. Thus, these halogen-containing solvents may not be strictly considered as inert since traces left in the dried coating would act as additional halide photoinitiators. However, until exposed to light, e.g. in the dark, such compounds are inert and suitable for use as solvents.

The amounts of catalyst precursor compounds employed should be sufficient to insure complete polymerization. It has been found that quite satisfactory results are obtained by providing an organohalogen compound in amounts by weight of from about 5% to about 50% relative to the weight of the polymerizable epoxide material, about 2% or less being amply effective with some monomer-catalyst systems.

Where the catalyst precursor is a synergistic combination as described hereinabove, the combined catalysts are present in amounts by weight of from about 1% to about 50% of the epoxide material while the relative amounts of the catalysts may vary from about 1 to 6 moles organohalogen per mole of the complex halogenide or any amount in excess thereof that is still soluble in and compatible with the resin system.

It may be desirable to include in the composition an inert pigment or filler, which may be present in even a major proportion by weight. Inclusion of such inert materials usually makes advisable a proportionate increase in the optimum amount of catalyst precursor needed. Nevertheless, the precursor rarely exceeds 50% of the entire weight of the composition.

The following examples will serve to further illustrate the present invention.

EXAMPLE I

Two solutions designated "A" and "B" were formulated to contain the following components:

| Part A | | |
|---|---|---|
| Bisphenol A glycidyl ether polymer (Epon 1009) | | 21.7g |
| Methyl ethyl ketone | | 16.2g |
| Toluene | | 16.2g |
| Part B | | |
| Methyl ethyl ketone | | 32.8g |
| Iodoform | | 9.8g |

The two parts were then mixed together and applied as a coating with a No. 12 Mayer rod onto a silicate coated aluminum offset plate. The resultant coating was allowed to dry in air in the dark after which it was exposed through a Kodak No. 2 step tablet (this type of tablet has 21 continuous tone steps varying from optical densities of 0.05 to 3.05) at 18 cm. distance from a Gates Raymaster 360 Watt Uviarc mercury lamp for 5 minutes and then heated at 110° C. for 3 minutes. When developed in methyl ethyl ketone by immersing the exposed plate therein and rubbing with cheesecloth, a length of cured epoxy coating remained on the strip as a negative image, corresponding to the first six steps of the step tablet.

EXAMPLE II

A composition was formulated to contain the following:

| 50% ECN 1299 in o-chloro-toluene (epoxy-cresol novolac) | 10.0g. |
|---|---|
| iodoform | 1.0g. |
| acetonitrile | 6.0ml. |

The above ingredients were mixed and coated onto an aluminum plate employing the procedure described in Example I. When the dried coated plate was exposed and developed as in Example I, two steps of the step tablet were reproduced.

When the above experiment was repeated omitting the last heating step, only one step of the step tablet was reproduced.

EXAMPLE III

| 50% ECN 1299 in o-chloro-toluene | 10.8g. |
|---|---|
| iodoform | 2.44g. |
| methyl ethyl ketone | 6.8g. |
| toluene | 4.0g. |

Samples of uncoated Redicote aluminum offset plate were coated with this formulation and allowed to dry in the dark.

A sample was exposed through a No. 2 Kodak step tablet to a 360W mercury arc for 5 minutes, heated at 110° C. for 5 minutes and developed in acetone. Three glossy steps, followed by four dull very thin steps were reproduced.

Another sample was exposed for 2 ½ minutes through a half-tone and line image transparency, and then heated for 5 minutes at 110° before final development in acetone. A negative photopolymer reproduction of the transparency image remained on the plate.

EXAMPLE IV

| 59.5% Araldite 7097 in methyl ethyl ketone | 3.65g. |
|---|---|
| methyl ethyl ketone | 3.42g. |
| toluene | 1.6g. |
| iodoform | 0.98g. |

Araldite 7097 is a trademark for bisphenol "A" glycidyl ether polymer available commercially from Ciba-Giegy Corporation. The above formulation was applied to an aluminum plate, exposed and developed as described in Example I. Four steps were reproduced on the developed plate.

EXAMPLE V

| allylglycidyl ether-glycidyl methacrylate copolymer | 3.62g. |
|---|---|
| toluene | 2.7g. |
| methyl ethyl ketone | 8.2g. |
| iodoform | 1.63g. |

Coatings on an aluminum offset plate employing the above ingredients were prepared employing the procedure of Example I. The coated plates were exposed to the light source of Example I for 30 seconds through the Kodak No. 2 step tablet and developed in methyl ethyl ketone yielding a cured strip corresponding to 17 steps. The developed coated was dyed black using a solution of Ciba Orasol Black dye in trichloroethylene.

Another plate with this coating was exposed through a halftone and line image transparency to a 1000W xenon lamp for 15 seconds and yielded an excellent photopolymer image after development in methyl ethyl ketone. It gave a clean brown/black image when subsequently dyed with the Orasol Black solution.

EXAMPLE VI

A coating was cast on an aluminum plate from a mixture consisting of 10.0g. of 50% ECN 1299 in toluene, 0.50g. of α,α'-dibromo-p-xylene and 6ml. of methylene chloride. After drying, part of the coated surface was exposed to actinic light for 10 minutes. The light source was a 360W Gates Raymaster Uviarc mercury lamp. Following exposure, the entire sample was heated for 5 minutes at 160° C. When washed with acetone, the unexposed portion of the coating washed off while the exposed portion remained on the plate.

EXAMPLE VII

The formulation described in Example VI was prepared except that 0.05g of carbon tetrabromide was substitued for the α,α'-dibromo-p-xylene. A coated aluminum plate was exposed on part of its surface for 2 minutes followed by heating the entire sample for 10 minutes at 160° C. When washed with acetone, the unexposed part of the coating washed off while the exposed part stayed on.

A similar sample that was exposed for 5 minutes but in which the heating step was omitted, also retained only the exposed coating when washed with acetone.

EXAMPLE VIII

The experiment of Example VII was repeated except that the carbon tetrabromide was replaced by iodoform. A coated aluminum sample was exposed on a portion of its surface for one minute followed by heating for 2 minutes at 160° C. When washed with acetone, only the unexposed area washed off.

A second sample gave comparable results when exposed for 5 minutes while eliminating the heating step.

A third sample gave a positive photopolymer release image copy of a negative bar chart transparency when exposed for 2 minutes, heated for 5 minutes at 160° C., and finally washed with acetone.

EXAMPLE IX

A solution of 10.8g of Epon 1009 in methyl ethyl ketone, 6.8g of additional methyl ethyl ketone, 4.03g of toluene and 2.44g of iodoform was prepared and used to coat aluminum plates. A sample plate was exposed on part of the coated surface for 30 seconds and then heated for 3 minutes at 110° C. When washed with methyl ethyl ketone, only the unexposed area washed off.

A second sample was exposed through a half-tone transparency for 1 ½ minutes and then heated for 3 minutes at 110° C. Development with methyl ethyl ketone gave a good release image negative copy of the half-tone image.

EXAMPLE X

An aluminum offset plate was coated with the formulation of Example IX, exposed through a negative transparency half-tone image for 1 minute and then heated for 3 minutes at 110° C. Development in methyl ethyl ketone yielded a positive photoresist copy of the transparency image. After heating the plate for 30 minutes at 110° C., the surface was rubbed with putz pomade. When inked, only the photoresist image areas accepted ink. The non-image areas (base aluminum) remained clear.

POLYMERIZABLE HALOGENATED EPOXY

EXAMPLE XI

This example illustrates use of halogen bound to the epoxy molecules for photopolymerization processes in the absence of any additional photo initiator.

A solution of 50% Epirez 529, a brominated novolacepichlorohydrin resin containing about 13% bromine, in monochlorobenzene was diluted with an equal volume of additional monochlorobenzene.

Coatings were cast on aluminum plates and exposed using the energy source employed in Example I. A coated sample was exposed on one half its surface for 7 minutes and then heated for 3 minutes at 110° C. When washed with acetone, only the unexposed portion of the coating washed off the surface. The exposed portion remained attached.

POLYMERIZABLE EPOXIDE-ORGANOHALOGEN-AMINO-AROMATICDIAZONIUM SALT

EXAMPLE XII

This example illustrates the synergistic effect of the combined catalyst precursors.

The following formulations were prepared:
A. 10g. 50% ECN 1299 in toluene
   0.250g. p-N-morpholinobenzene diazonium hexafluorophosphate
   6 ml. acetonitrile
   0.588g. iodoform
B. 10g. 50% ECN 1299 in toluene
   6 ml. acetonitrile
   0.588g. iodoform
C. 10g. 50% ECN 1299 in toluene
   6 ml acetonitrile
   0.250g. p-N-morpholinobenzene diazonium hexafluorophosphate
D. Same as formulation (A) except that 1.176g. of iodoform were employed.
E. Same as formulation (C) except that 0.500g. of p-N-morpholinobenzene diazonium hexafluorophosphate were employed.

The sample strips were applied to an aluminum substrate and permitted to dry at room temperature. After drying, the samples were:
1. exposed to a Gates Raymaster Mercury Uviarc at 20cm. for 1 minute, 2 minutes and 5 minutes respectively and developed in methyl ethyl ketone.
2. exposed for 5 minutes as in step 1), heated for 5 minutes at 110° C. and then developed in methyl ethyl ketone.
3. exposed for 5 minutes as in step 1), heated for 3 minutes at 110° C. and then developed in methyl ethyl ketone.

The results are reported in the Table which follows.

| | RESULTS OF TREATMENTS AFTER DEVELOPMENT | | | | |
|---|---|---|---|---|---|
| Formulation Precursor | (1) hv, 1 min. | (2) hv, 2 min. | (3) hv, 5 min. | (4) hv, 2 min. Δ, 3 min. 110° C | (5) hv, 5 min. Δ, 3 min. 100° C |
| (A) Iodoform & Diazonium Catalyst | Soft Coating Remained On | Good Film Coating Remained | — | — | — |
| (B) | Washed | Washed | Thin Film | Washed | Good Film |

-continued

| Formulation Precursor | (1) hv, 1 min. | (2) hv, 2 min. | (3) hv, 5 min. | (4) hv, 2 min. Δ, 3 min. 110° C | (5) hv, 5 min. Δ, 3 min. 100° C |
|---|---|---|---|---|---|
| Iodoform, Alone | Off | Off | Coating Remained | Off | Coating Remained |
| (C) Diazonium Catalyst, Alone 5% | Washed Off | Washed Off | Washed Off | Good Film Coating Remained | Good Film Coating Remained |
| (D) Diazonium Catalyst, 5% Iodoform 23.4% | Good Film Coating Remained, after 34 Sec. Exposure | Good Film Coating Remained | — | — | — |
| (E) Diazonium Catalyst, Alone 10% | Washed Off | Washed Off | Washed Off | Good Film Coating Remained | Good Film Coating Remained |

As will be seen from the above Table, the combination of the organohalogen and diazonium catalyst of the invention exerts a synergistic effect on the rate of curing of the polymer since, for example, iodoform alone requires 5 to 6 minutes total exposure and/or heat to insolubilize the coating where it is exposed. Similarly, the aryl diazonium catalyst alone requires the combination of exposure for 30 seconds and heat. for three minutes. Yet the combination of the invention is cured to a hard glossy finish in 2 minutes, a time significantly less than that required with either of the precursors alone even when higher concentrations of the individual precursors are employed, (see experiments D) and E) above) and additionally no heat is needed with the synergistic combination.

EXAMPLE XIII (A) A formulation was prepared to contain:
12.5g 1,4-butanedioldiglycidyl ether (Ciba Araldite RD-2)
12.5g (3,4-epoxycyclohexyl)-3,4-epoxycyclohexane carboxylate (Ciba Araldite CY179)
0.125g p-N-morpholinobenzene diazonium hexafluorophosphate
0.422g iodoform Sample coatings were made on aluminum plate and paperboard samples, using a No. 6 wire-wound drawdown rod. After exposing to a 360 W Uviarc lamp at 15 cm. for 2 minutes, the coating cured to a hard solid.

(B) When the same formulation as in (A) above was prepared substituting 0.283g of α,α'-dibromo-p-xylene for the iodoform therein and exposed as in Part A above, comparable results were obtained.

EXAMPLE XIV

A formulation was prepared as described in Example XIII, Part A except that 25g of RD-2, 25g of CY179, 0.125g. diazonium catalyst and 0.422g iodoform were employed.

A coating made with a No. 6 rod on paperboard began to harden after 60 seconds exposure to the 360 W Uviarc lamp.

It is thought that the invention and many of its attendant advantages will be understood from the foregoing description and it will be apparent that various changes may be made in the matter of the ingredients, the identity and their proportions and in the steps of the process and their order of accomplishment without departing from the spirit and scope of the invention or sacrificing all of its material advantages, the form hereinbefore described being merely a preferred embodiment thereof.

I claim:
1. A polymerizable composition consisting of:

A monomeric or prepolymeric epoxide material or mixture thereof, said epoxide material being polymerizable to higher molecular weights cationically through the action of a cationic catalyst and being selected from the group consisting of glycidyl ethers of bisphenol A; epoxy-cycloalkanes; alkylene oxides; monoglycidyl ethers of the formula

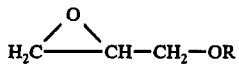

wherein R is alkyl or aryl;
epoxy-esters; epoxy phenol or cresol novolacs; epoxy-vinyls; halogenated epoxides and bis(epoxy alkyl) ethers of alkylene glycols and mixtures thereof;
a radiation-sensitive catalyst precursor which decomposes upon exposure to irradiation to provide an active catalyst effective to initiate cationic polymerization of said epoxide material, said precursor being present in an amount by weight equal to from about 1 to about 50% of the epoxide material and being the combination of (1) an organohalogen selected from the group consisting of iodoform, bromoform, carbon tetrabromide and α,α'-dibromoxylene and (2) an amino-aryl diazonium salt of a complex halogenide which releases a Lewis Acid upon exposure to irradiation, the anion of said complex halogenide being selected from the formula $[MX_{n+m}]^{-m}$ wherein M is Fe, Sn, P, As, Sb, B and Bi; X is halogen, m is the net charge on the complex halogenide and n is the oxidation state of M, the relative proportion in said combination being from about 1 to about 6 moles organohalogen per mole of amino-aryl diazonium complex.

2. The composition of claim 1, in which the catalyst precursor is an oranohalogen and an amino-aromatic diazonium salt of a hexafluorophosphate.

3. The composition of claim 2, in which the organohalogen is iodoform, bromoform, carbon tetrabromide or α,α'-dibromoxylene and the diazonium salt is p-N-morpholinobenzene diazonium hexafluorophosphate.

4. The composition of claim 2 wherein said epoxide material is a copolymer of allylglycidyl ether and glycidyl methacrylate.

5. The composition of claim 2, in which the epoxide material is a mixture of a bis(epoxyalkyl) ether of an alkylene glycol and an epoxy ester.

6. The composition of claim 5, wherein said bis(epoxyalkyl ether is 1,4-butanedioldiglycidyl ether and said epoxy-ester is 2,3-epoxycyclohexyl-3, 4-epoxycyclohexane carboxylate.

* * * * *